(12) United States Patent
Lee et al.

(10) Patent No.: US 10,719,152 B2
(45) Date of Patent: Jul. 21, 2020

(54) DISPLAY DEVICE AND METHOD OF MANUFACTURING THE SAME

(71) Applicant: LG Display Co., Ltd., Seoul (KR)

(72) Inventors: Young-Wook Lee, Goyang-si (KR); Woo-Chan Cho, Paju-si (KR)

(73) Assignee: LG DISPLAY CO., LTD, Seoul (KR)

( * ) Notice: Subject to any disclaimer, the term of this patent is extended or adjusted under 35 U.S.C. 154(b) by 21 days.

(21) Appl. No.: 15/963,973

(22) Filed: Apr. 26, 2018

(65) Prior Publication Data
US 2018/0314372 A1    Nov. 1, 2018

(30) Foreign Application Priority Data
Apr. 27, 2017    (KR) .................. 10-2017-0054218

(51) Int. Cl.
*G06F 3/041*     (2006.01)
*H01L 27/32*     (2006.01)
*G09G 3/3208*    (2016.01)
*G06F 3/044*     (2006.01)

(52) U.S. Cl.
CPC ............ *G06F 3/0412* (2013.01); *G06F 3/044* (2013.01); *G09G 3/3208* (2013.01); *H01L 27/322* (2013.01); *H01L 27/323* (2013.01)

(58) Field of Classification Search
CPC ... G09G 3/3208; H01L 27/322; H01L 27/323; G06F 3/0412; G06F 3/044
See application file for complete search history.

(56) References Cited

U.S. PATENT DOCUMENTS

| 6,791,166 B1* | 9/2004 | Foster ............... H01L 23/49503 257/666 |
| 2012/0062481 A1 | 3/2012 | Kim et al. |
| 2012/0073866 A1* | 3/2012 | Hirai ................... G06F 3/044 174/257 |
| 2012/0235691 A1* | 9/2012 | Ho ....................... G06F 3/0418 324/658 |
| 2013/0057497 A1* | 3/2013 | Cho ....................... G06F 3/044 345/173 |
| 2014/0078077 A1* | 3/2014 | Choi ..................... H01L 27/323 345/173 |

(Continued)

FOREIGN PATENT DOCUMENTS

| JP | 2013-117816 A | 6/2013 |
| JP | 2014-85771 A | 5/2014 |

(Continued)

*Primary Examiner* — Amare Mengistu
*Assistant Examiner* — Crystal Mathews
(74) *Attorney, Agent, or Firm* — Seed IP Law Group LLP

(57) ABSTRACT

Disclosed are a display device that enables reduction in thickness and weight and a method of manufacturing the same. The display device having a touch sensor includes a touch sensing line and a touch driving line, which are formed on an encapsulation unit and intersect each other with a touch insulation layer interposed therebetween. The touch insulation layer intersects with any one of the touch sensing line and the touch driving line, which may result in the simplified structure. In addition, touch electrodes are disposed on the encapsulation unit, which may make a separate attachment process be unnecessary, resulting in a simplified manufacturing process and reduced costs.

16 Claims, 12 Drawing Sheets

(56) References Cited

U.S. PATENT DOCUMENTS

| | | | |
|---|---|---|---|
| 2015/0185915 A1* | 7/2015 | Lim | G06F 3/044 |
| | | | 345/174 |
| 2016/0117031 A1* | 4/2016 | Han | G06F 3/0412 |
| | | | 345/174 |
| 2016/0154499 A1 | 6/2016 | Bae et al. | |
| 2016/0246415 A1* | 8/2016 | Bae | G06F 3/044 |
| 2016/0259446 A1* | 9/2016 | Kim | G06F 3/044 |
| 2017/0147133 A1* | 5/2017 | Choi | G06F 3/044 |
| 2018/0006265 A1* | 1/2018 | Oh | H01L 51/5237 |
| 2018/0033829 A1* | 2/2018 | Oh | H01L 27/3276 |
| 2018/0095566 A1* | 4/2018 | Lee | H01L 27/3244 |
| 2018/0095567 A1* | 4/2018 | Lee | H01L 51/5284 |
| 2018/0107316 A1* | 4/2018 | Hanari | G06F 3/0412 |
| 2018/0182817 A1* | 6/2018 | Jo | H01L 27/15 |
| 2018/0314372 A1* | 11/2018 | Lee | G06F 3/0412 |
| 2018/0329552 A1* | 11/2018 | Song | G06F 3/0416 |
| 2018/0329554 A1* | 11/2018 | Beak | H01L 51/5221 |
| 2018/0331160 A1* | 11/2018 | Beak | H01L 27/323 |
| 2019/0018530 A1* | 1/2019 | Lee | G06F 3/044 |
| 2019/0035860 A1* | 1/2019 | Oh | G06F 3/0412 |
| 2020/0019294 A1* | 1/2020 | Lee | H01L 27/322 |
| 2020/0026377 A1* | 1/2020 | Gwon | G06F 3/0446 |
| 2020/0026390 A1* | 1/2020 | Gwon | G06F 3/0412 |
| 2020/0067013 A1* | 2/2020 | Oh | H01L 51/5237 |

FOREIGN PATENT DOCUMENTS

| | | |
|---|---|---|
| JP | 2014-153791 A | 8/2014 |
| JP | 2015-164000 A | 9/2015 |
| JP | 2016-13958 A | 1/2016 |
| JP | 2017-68300 A | 4/2017 |
| WO | 2015/098608 A1 | 7/2015 |

\* cited by examiner

DISPLAY DEVICE AND METHOD OF MANUFACTURING THE SAME

CROSS-REFERENCE TO RELATED APPLICATION(S)

This application claims the benefit of Korean Patent Application No. 10-2017-0054218, filed Apr. 27, 2017, which is hereby incorporated by reference as if fully set forth herein.

BACKGROUND

Technical Field

The present disclosure relates to a display device and a method of manufacturing the same, and more particularly, to a display device and a method of manufacturing the same that are capable of achieving a simplified manufacturing process and reduced costs.

Description of the Related Art

A touchscreen is an input device that allows a user to input a command by selecting a content appearing on a screen of a display device or the like with the human hand or an object. That is, the touchscreen converts a contact position that the human hand or the object directly touches into an electrical signal, and receives the content selected at the contact position as an input signal. The touchscreen may substitute for a separate input device, which is connected to the display device and operates, such as a keyboard or a mouse, and thus the use range thereof is gradually expanding.

Such a touchscreen is generally attached to the front surface of a display panel, such as a liquid crystal display panel or an organic light-emitting diode display panel, via an adhesive in many cases. In this case, since the touchscreen is separately manufactured and attached to the front surface of the display panel, the manufacturing process is complicated and the costs are increased due to addition of such an attachment process.

BRIEF SUMMARY

Accordingly, the present disclosure is directed to a display device and a method of manufacturing the same that substantially obviate one or more problems due to limitations and disadvantages of the related art.

The present disclosure has been provided to solve the problems described above, and in various embodiments, the present disclosure provides a display device and a method of manufacturing the same that are capable of achieving a simplified manufacturing process and reduced costs.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device having a touch sensor according to one or more embodiments of the present disclosure includes a touch sensing line and a touch driving line, which are formed on an encapsulation unit and intersect each other with a touch insulation layer interposed therebetween. The touch insulation layer intersects with any one of the touch sensing line and the touch driving line, which may result in the simplified structure. In addition, touch electrodes are disposed on the encapsulation unit, which may make a separate attachment process be unnecessary, resulting in a simplified manufacturing process and reduced costs.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, embodiments according to the present disclosure will be described in detail with reference to the accompanying drawings.

Figure 1:
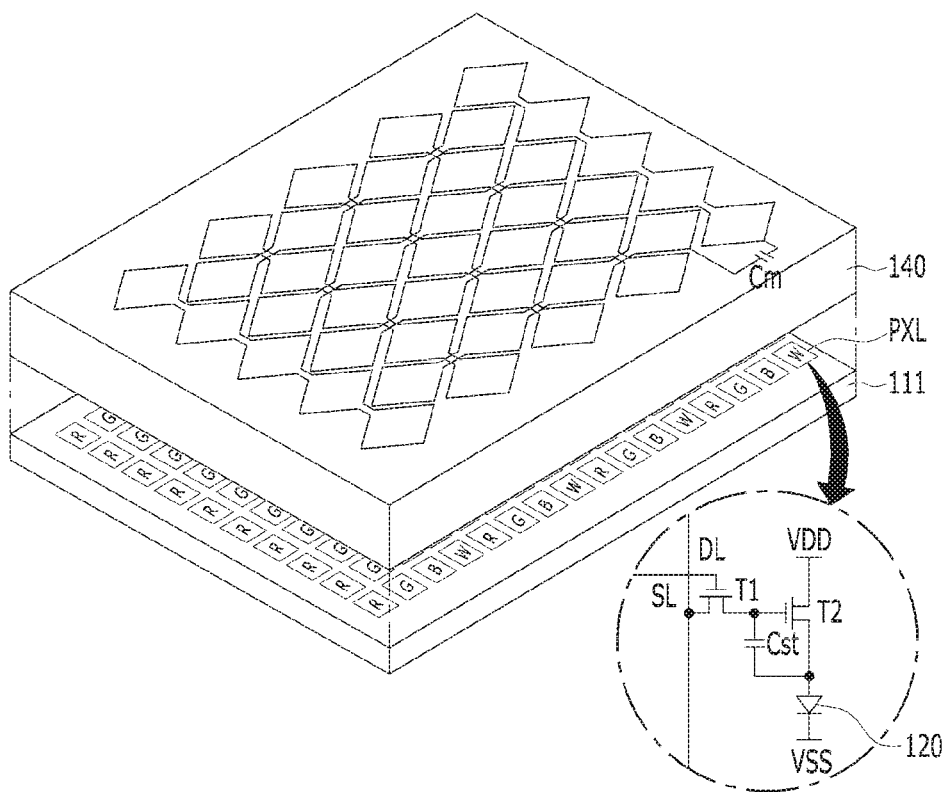
FIG. 1 is a perspective view illustrating an organic light-emitting display device having a touch sensor according to a first embodiment of the present disclosure.

FIG. 1 is a perspective view illustrating an organic light-emitting diode display device having a touch sensor according to the present disclosure.

Figure 2:
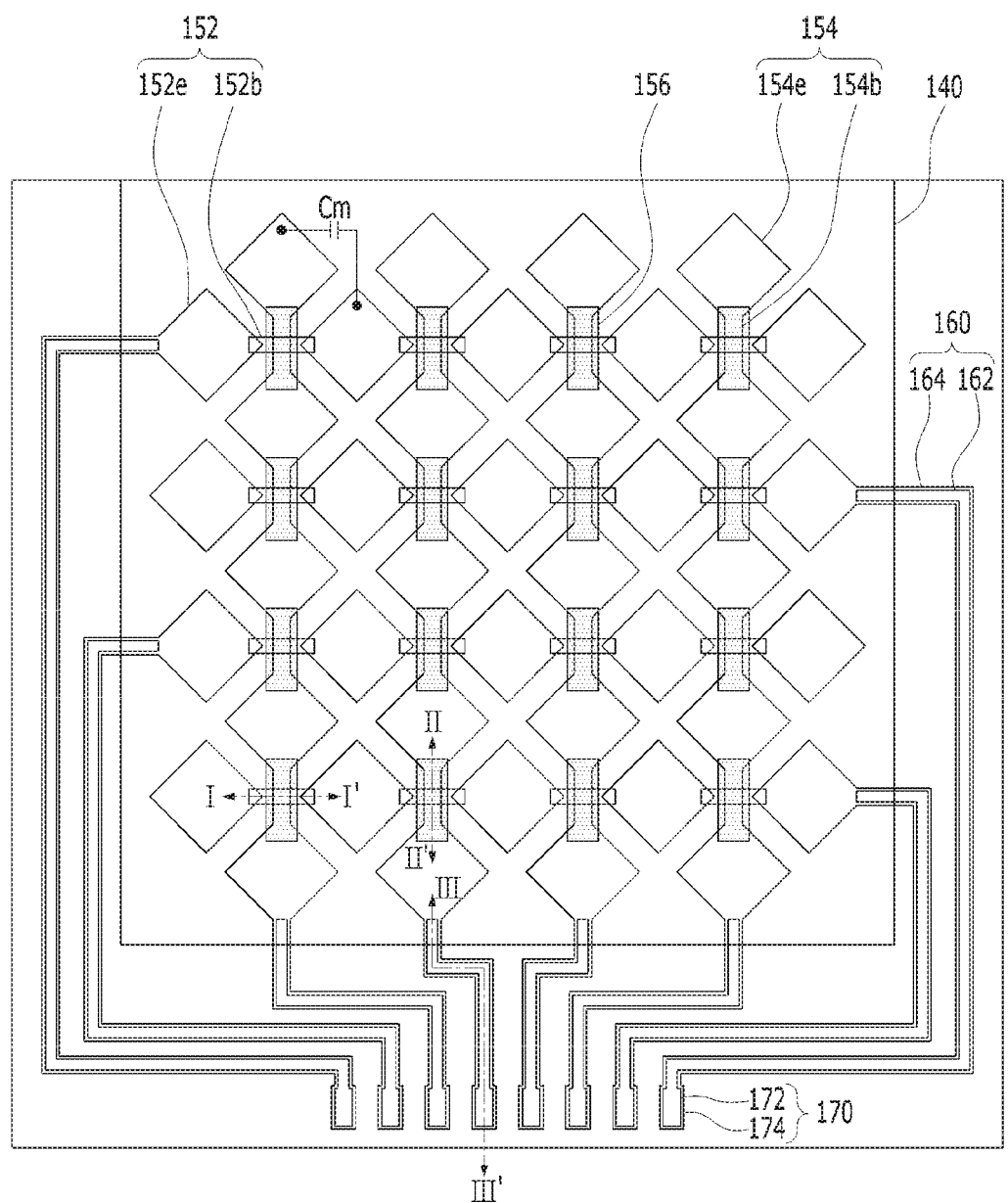
FIG. 2 is a plan view illustrating the organic light-emitting display device having the touch sensor illustrated in FIG. 1.

The organic light-emitting diode display device having a touch sensor illustrated in FIG. 1 senses the presence or absence of a touch and a touch position by sensing a variation in mutual capacitance Cm (touch sensor) in response to a user touch via touch electrodes 152e and 154e illustrated in FIG. 2 for a touch period. Then, the organic light-emitting diode display device having a touch sensor illustrated in FIG. 1 displays an image via unit pixels each including a light-emitting element 120. Each unit pixel may include red (R), green (G), and blue (B) subpixels PXL, or may include red (R), green (G), blue (B), and white (W) subpixels PXL.

To this end, the organic light-emitting diode display device illustrated in FIG. 1 includes a plurality of subpixels PXL arranged in a matrix form on a substrate 111 formed of a plastic or glass material, an encapsulation unit 140 disposed on the subpixels PXL, and a mutual capacitance array Cm disposed on the encapsulation unit 140.

Each of the subpixels PXL includes a pixel drive circuit and the light-emitting element 120 connected to the pixel drive circuit.

The pixel drive circuit includes a switching transistor T1, a driving thin-film transistor T2, and a storage capacitor Cst. Meanwhile, in the present disclosure, a structure in which the pixel drive circuit includes two transistors T and one capacitor C has been described by way of example, but the present disclosure is not limited thereto. That is, a pixel drive circuit having a 3T1C structure or 3T2C structure in which three or more transistors T and one or more capacitors C are provided may be used.

The switching transistor T1 is turned on when a scan pulse is supplied to a scan line SL, and supplies a data signal supplied to a data line DL to the storage capacitor Cst and a gate electrode of the driving thin-film transistor T2.

The driving thin-film transistor T2 controls current to be supplied from a high-voltage (VDD) supply line to the light-emitting element 120 in response to the data signal supplied to the gate electrode of the driving thin-film transistor T2, thereby adjusting the amount of emission of light from the light-emitting element 120. Then, even if the switching transistor T1 is turned off, the driving thin-film transistor T2 maintains the emission of light of the light-emitting element 120 by supplying a constant amount of current thereto by a voltage charged in the storage capacitor Cst until a data signal of a next frame is supplied.

Figure 3:
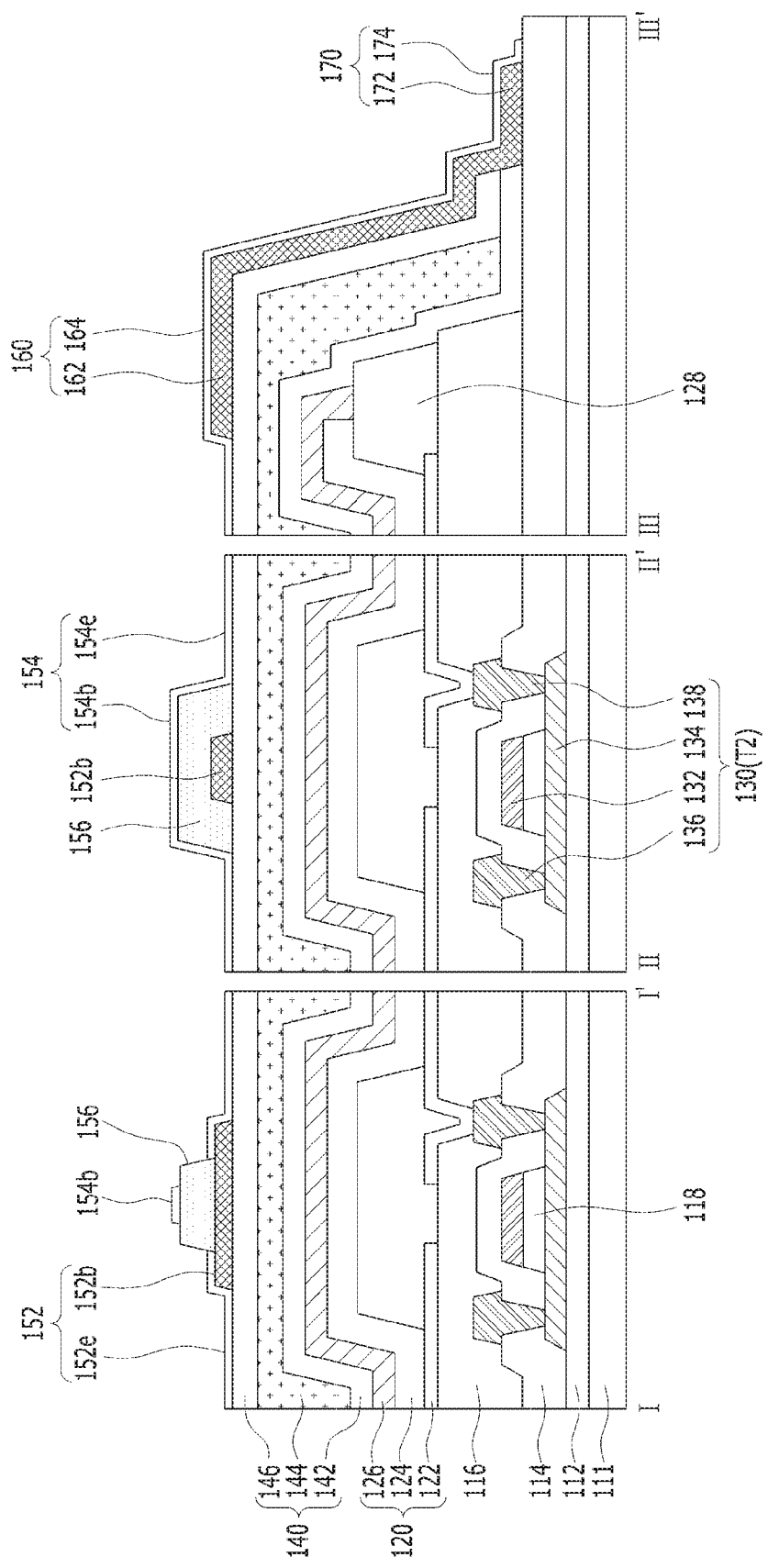
FIG. 3 is a cross-sectional view illustrating the organic light-emitting display device having the touch sensor taken along lines "I-I," "II-II," and "III-III" of FIG. 2.

The driving thin-film transistor T2 or 130, as illustrated in FIG. 3, includes a semiconductor layer 134 disposed on a buffer layer 112, a gate electrode 132 overlapping the semiconductor layer 134 with a gate insulation layer 118 therebetween, and source and drain electrodes 136 and 138 formed on an interlayer insulation layer 114 to come into contact with the semiconductor layer 134. Here, the semiconductor layer 134 is formed of at least one of an amorphous semiconductor material, a polycrystalline semiconductor material, and an oxide semiconductor material.

The light-emitting element 120 includes an anode electrode 122, at least one light-emitting stack 124 formed on the anode electrode 122, and a cathode electrode 126 formed on the light-emitting stack 124.

The anode electrode 122 is electrically connected to the drain electrode 138 of the driving thin-film transistor 130, which is exposed through a pixel contact hole formed in a protective layer 116.

The light-emitting stack 124 is formed on the anode electrode 122 in a light-emitting area that is defined by a bank 128. The light-emitting stack 124 is formed by stacking a hole-related layer, an organic light-emitting layer, and an electron-related layer on the anode electrode 122 in this order or in the reverse order. In addition, the at least one light-emitting stack 124 may include first and second light-emitting stacks, which face each other with a charge generation layer therebetween. In this case, the organic light-emitting layer of any one of the first and second light-emitting stacks generates blue light, and the organic light-emitting layer of the other one of the first and second light-emitting stacks generates yellow-green light, whereby white light is generated via the first and second light-emitting stacks. Since the white light generated in the light-emitting stack 124 is incident on a color filter located above or below the light-emitting stack 124, a color image may be realized. In addition, colored light corresponding to each subpixel may be generated in each light-emitting stack 124 to realize a color image, without a separate color filter. That is, the light-emitting stack 124 of the red (R) subpixel may generate red light, the light-emitting stack 124 of the green (G) subpixel may generate green light, and the light-emitting stack 124 of the blue (B) subpixel may generate blue light.

The cathode electrode 126 may be formed so as to face the anode electrode 122 with the light-emitting stack 124 therebetween, and is connected to a low-voltage (VSS) supply line.

The encapsulation unit 140 prevents external moisture or oxygen from entering the light-emitting element 120, which is vulnerable to the external moisture or oxygen. To this end, the encapsulation unit 140 includes a plurality of inorganic encapsulation layers 142 and 146 and an organic encapsulation layer 144 disposed between the inorganic encapsulation layers 142 and 146. The inorganic encapsulation layer 146 is the uppermost layer. Here, the encapsulation unit 140 includes at least two inorganic encapsulation layers 142 and 146 and at least one organic encapsulation layer 144. In the present disclosure, the structure of the encapsulation unit 140 in which the organic encapsulation layer 144 is disposed between first and second inorganic encapsulation layers 142 and 146 will be described by way of example.

The first inorganic encapsulation layer 142 is formed on the substrate 111, on which the cathode electrode 126 has been formed, so as to be closest to the light-emitting element 120. The first inorganic encapsulation layer 142 is formed of an inorganic insulation material that is capable of being deposited at a low temperature, such as silicon nitride ($SiN_x$), silicon oxide ($SiO_x$), silicon oxide nitride (SiON), or aluminum oxide ($Al_2O_3$). Thus, since the first inorganic encapsulation layer 142 is deposited under a low-temperature atmosphere, it is possible to prevent damage to the light-emitting stack 124, which is vulnerable to a high-temperature atmosphere, during the deposition process of the first inorganic encapsulation layer 142.

The organic encapsulation layer 144 serves to dampen stress between the respective layers due to bending of the organic light-emitting diode display device and to increase planarization performance. The organic encapsulation layer 144 is formed on the substrate 111, on which the first inorganic encapsulation layer 142 has been formed, using an organic insulation material, such as an acryl resin, epoxy resin, polyimide, polyethylene, or silicon oxycarbide (SiOC).

The second inorganic encapsulation layer 146 is formed on the substrate 111, on which the organic encapsulation layer 144 has been formed, so as to cover the upper surface and the side surface of each of the organic encapsulation layer 144 and the first inorganic encapsulation layer 142. Thus, the second inorganic encapsulation layer 146 minimizes or prevents external moisture or oxygen from entering the first inorganic encapsulation layer 142 and the organic encapsulation layer 144. The second inorganic encapsulation layer 146 is formed of an inorganic insulation material, such as silicon nitride ($SiN_x$), silicon oxide ($SiO_x$), silicon oxide nitride (SiON), or aluminum oxide ($Al_2O_3$).

On the encapsulation unit 140 described above, a touch sensing line 154 and a touch driving line 152 are disposed so as to intersect each other with a touch insulation layer 156 therebetween. The term "intersect" is used herein to mean that one element crosses over or overlaps another element, and does not necessarily mean that the two elements contact each other. For example, the touch sensing line 154 and touch driving line 152 may intersect each other, but may not physically contact one another since the touch insulation layer 156 is positioned therebetween. Here, the touch insulation layer 156 is disposed so as to intersect any one of the touch sensing line 154 and the touch driving line 152 at the intersections of the touch sensing line 154 and the touch driving line 152. The mutual capacitance array Cm is formed at the intersections of the touch sensing line 154 and the touch driving line 152. Thus, the mutual capacitance array Cm serves as a touch sensor by storing charges in response to a touch driving pulse supplied to the touch driving line 152 and discharging the stored charge to the touch sensing line 154.

The touch driving line 152 includes a plurality of first touch electrodes 152e, and first bridges 152b, which electrically interconnect the first touch electrodes 152e.

The first touch electrodes 152e are equidistantly spaced apart from each other in the X-direction, which is a first direction, on the second inorganic encapsulation layer 146, which is the uppermost layer of the encapsulation unit 140. Each of the first touch electrodes 152e is electrically connected to an adjacent first touch electrode 152e via the first bridge 152b. Here, the first touch electrode 152e is electrically connected to a portion of the upper surface and the side surface of the first bridge 152b, which is exposed by the touch insulation layer 156.

The first touch electrodes 152e are formed of a transparent conductive layer having strong corrosion resistance and acid resistance, such as ITO, IZO, ZnO, IGZO, or ITO/Ag/ITO. The first touch electrodes 152e, formed of the transparent conductive layer, is configured to completely cover the upper surface and the side surface of the first bridge 152b, which is exposed by the touch insulation layer 156, and is brought into contact with the side surface of the touch insulation layer 156. Thereby, through the use of the first touch electrodes 152e, it is possible to prevent the first bridge 152b from being exposed outwards, and to prevent damage to the first bridge 152b, such as corrosion.

The first bridge 152b is disposed on the second inorganic encapsulation layer 146 in the same plane as the first touch electrode 152e. The length of the first bridge 152b is greater than the line width of the touch insulation layer 156 disposed on the first bridge 152b. Thereby, since both sides of the first bridge 152b are exposed by the touch insulation layer 156, which intersects with the first bridge 152b, the first bridge 152b is directly connected to the first touch electrode 152e without a separate contact hole.

Since the first bridge 152b is disposed so as to overlap the bank 128, it is possible to prevent deterioration in the aperture ratio due to the first bridge 152b. The first bridge 152b is formed in a single layer or in multiple layers using an opaque conductive layer having good conductivity, such as Al, Ti, Cu, or Mo. For example, the first bridge 152b is formed in a triple-layered structure as a stack of Ti/Al/Ti or Mo/Al/Mo.

The touch sensing line 154 includes a plurality of second touch electrodes 154e, and second bridges 154b, which electrically interconnect the second touch electrodes 154e.

The second touch electrodes 154e are equidistantly spaced apart from each other in the Y-direction, which is a second direction, on the second inorganic encapsulation layer 146. Each of the second touch electrodes 154e is electrically connected to an adjacent second touch electrode 154e via the second bridge 154b.

The second bridge 154b extends in the Y-direction from the second touch electrode 154e, and thus is electrically connected to the second touch electrode 154e without a separate contact hole. The second bridge 154b is formed on the touch insulation layer 156, which is disposed so as to intersect the first bridge 152b, so as to overlap the touch insulation layer 156. Here, the line width of the second bridge 154b is less than the line width of the touch insulation layer 156, which is disposed below the second bridge 154b so as to extend along the second bridge 154b. Thereby, the first and second bridges 152b and 154b are insulated from each other with the touch insulation layer 156 therebetween, which takes the form of an island disposed only at the intersection of the first and second bridges 152b and 154b.

Since the second bridge 154b is disposed so as to overlap the bank 128, it is possible to prevent deterioration in the aperture ratio due to the second bridge 154b. In the same manner as the first and second touch electrodes 152e and 154e, the second bridge 154b is formed of a transparent conductive layer, such as ITO, IZO, ZnO, IGZO, or ITO/Ag/ITO.

In this way, the touch driving line 152 and the touch sensing line 154 of the present disclosure are connected respectively to touch pads 170 via routing lines 160.

The routing line 160 extends from the first touch electrode 152e to at least one of the left side and the right side of an active area, and is connected to the touch pad 170. In addition, the routing line 160 extends from the second touch electrode 154e to at least one of the upper side and the lower side of the active area, and is connected to the touch pad 170. The arrangement of the routing lines 160 may be changed in various ways according to design requirements of the display device.

The routing line 160 is formed between each of the first and second touch electrodes 152e and 154e and the touch pad 170, and electrically connects each of the first and second touch electrodes 152e and 154e to the touch pad 170. The upper portion of the routing line 160, which is electrically connected to each of the first and second touch electrodes 152e and 154e, is disposed above the encapsulation unit 140. The lower portion of the routing line 160, which is connected to the touch pad 170, is disposed on any one of the protective layer 116, the interlayer insulation layer 114, the gate insulation layer 118, and the buffer layer 112, which are insulation layers disposed below the light-emitting element 120. The side portion of the routing line 160, disposed between the upper portion and the lower portion of the routing line 160, is formed so as to cover the side surface of the second inorganic encapsulation layer 146.

Each of the routing lines 160 includes a lower routing line 162 and an upper routing line 164 for capping the lower routing line 162.

The lower routing line 162 is formed by the same mask process as the first bridge 152b using the same material as the first bridge 152b. The lower routing line 162 is formed so as to cover and be brought into contact with the side surface of the encapsulation unit 140.

The upper routing line 164 is formed of the same material as the first and second touch electrodes 152e and 154e and the second bridge 154b. The upper routing line 164 extends from each of the first and second touch electrodes 152e and 154e, and is connected to each of the first and second touch electrodes 152e and 154e. In addition, the upper routing line 164 is formed on the lower routing line 162 so as to cover the side surface and the upper surface of the lower routing line 162, and thus is electrically connected to the lower routing line 162. In this way, since the upper routing line 164 is formed on the lower routing line 162 so as to be directly connected to the lower routing line 162 without a separate contact hole, a connection fault between the upper routing line 162 and the lower routing line 164 may be prevented. In addition, since the routing line 160, which includes the lower routing line 162 and the upper routing line 164, has a multilayered structure, it is possible to reduce the resistance of the routing line 160. Moreover, since the routing line 160 has a multilayered structure, even if short-circuit occurs in any one of the upper and lower routing lines 162 and 164, the other routing line may perform transmission of the touch driving pulse and the touch signal.

The touch pads 170 are connected to a signal transmission film on which a touch drive unit (not illustrated) is mounted. The touch pads 170 may be disposed in at least one of one side area and the other side area of the substrate 111, together with display pads (not illustrated) connected respectively to at least one of the data line DL, the scan line SL, the low-voltage (VSS) supply line, and the high-voltage (VDD) supply line. Alternatively, the touch pads 170 and the display pads may be disposed in different non-active areas. Meanwhile, the arrangement of the touch pads 170 is not limited to the structure of FIG. 2, and may be changed in various ways according to design requirements of the display device.

Each of the touch pads 170 includes pad electrodes 172 and 174 formed in multiple layers, and the pad electrode 174 as the uppermost layer is disposed to cover the upper surface and the side surface of the other pad electrode 172 except the pad electrode 174 as the uppermost layer. In the present disclosure, the structure in which the touch pad 170 includes a lower pad electrode 172 and an upper pad electrode 174 will be described by way of example.

The lower pad electrode 172 is formed by the same mask process as the first bridge 152b using the same material as the first bridge 152b. The lower pad electrode 172 extends from the lower routing line 162 on the insulation layer, which is disposed below the light-emitting element 120, and thus, is directly connected to the lower routing line 162. Here, the insulation layer disposed below the light-emitting element 120 is any one of the protective layer 116, the interlayer insulation layer 114, the gate insulation layer 118, and the buffer layer 112.

The upper pad electrode 174 is formed by the same mask process as the second bridge 154b using the same material as the second bridge 154b. The upper pad electrode 174 is formed on the lower pad electrode 172 for capping the lower pad electrode 172, and thus, is directly connected to the lower pad electrode 172 without a separate contact hole.

In this way, in the present disclosure, each of the first and second touch electrodes 152e and 154e and the second bridge 154b is formed of a transparent conductive layer having strong corrosion resistance and acid resistance, such as ITO, IZO, ZnO, IGZO, or ITO/Ag/ITO. Thus, in the present disclosure, since a separate protective structure for protecting each of the first and second touch electrodes 152e and 154e and the second bridge 154b, which are located at the uppermost portion of the touch sensor, is not necessary, the simplified structure and the minimized manufacturing process may be achieved. Moreover, in the present disclosure, each of the upper routing line 164 and the upper pad electrode 174 is formed of a transparent conductive layer having strong corrosion resistance and acid resistance, such as ITO, IZO, ZnO, IGZO, or ITO/Ag/ITO. In this case, in the present disclosure, the lower routing line 162 and the lower pad electrode 172, which are formed of an opaque conductive layer, are protected respectively by the upper routing line 164 and the upper pad electrode 174, which are formed of a transparent conductive layer. Thereby, in the present disclosure, since a separate protective structure for protecting each of the lower routing line 162 and the lower pad electrode 172 is not necessary, the simplified structure and the minimized manufacturing process may be achieved. Moreover, unlike a conventional organic light-emitting diode display device configured such that a touchscreen is attached thereto via an adhesive, the organic light-emitting diode display device according to the present disclosure is configured such that the touch electrodes 152e and 154e are disposed on the encapsulation unit 140, which makes a separate attachment process be unnecessary, resulting in a simplified manufacturing process and reduced costs.

FIGS. 4A to 6B are plan views and cross-sectional views for explaining a method of manufacturing the organic light-emitting diode display device having the touch sensor illustrated in FIGS. 2 and 3.

Figure 4A:
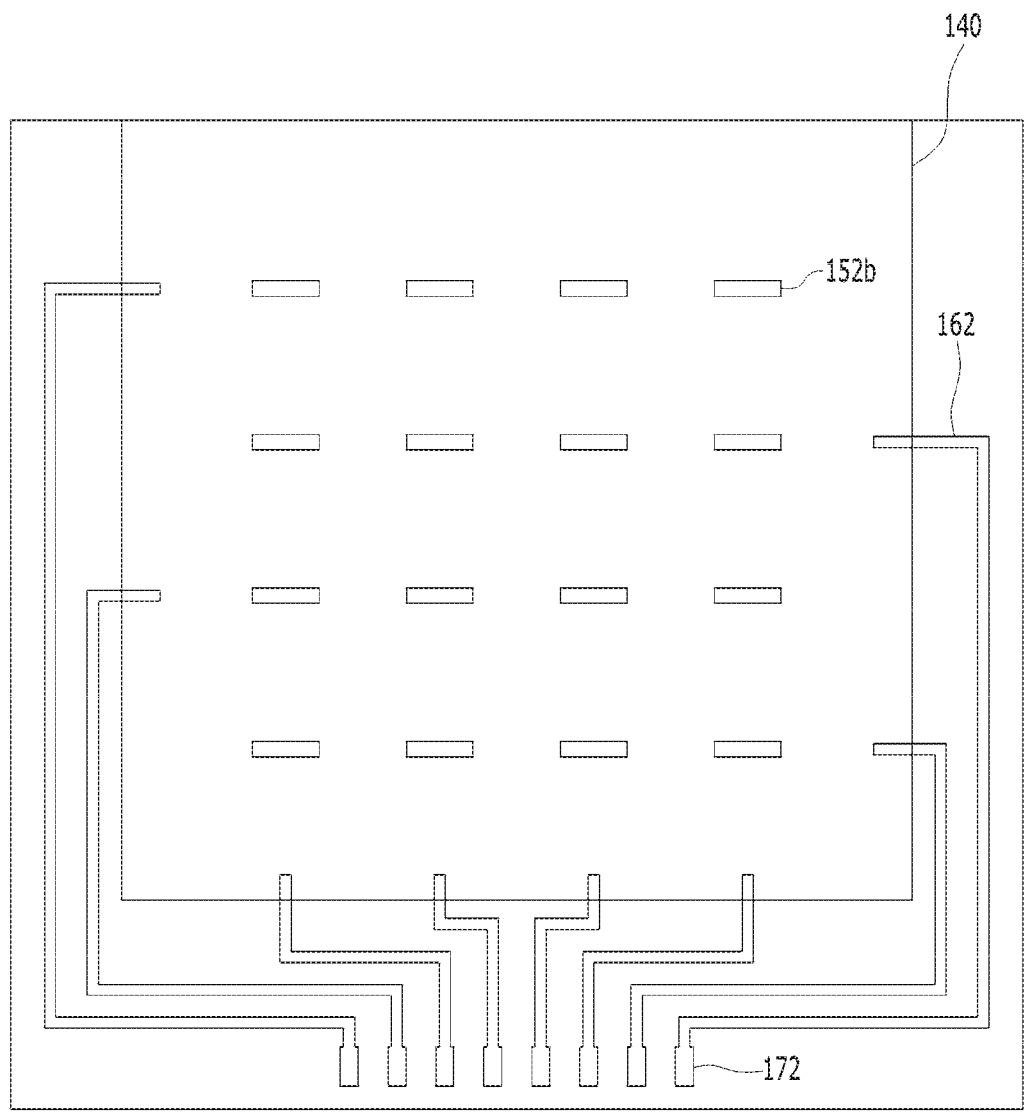
FIGS. 4A and 4B are a plan view and a cross-sectional view, respectively, for explaining a method of manufacturing a first bridge, a lower routing line, and a lower pad electrode illustrated in FIGS. 2 and 3.
Figure 4B:
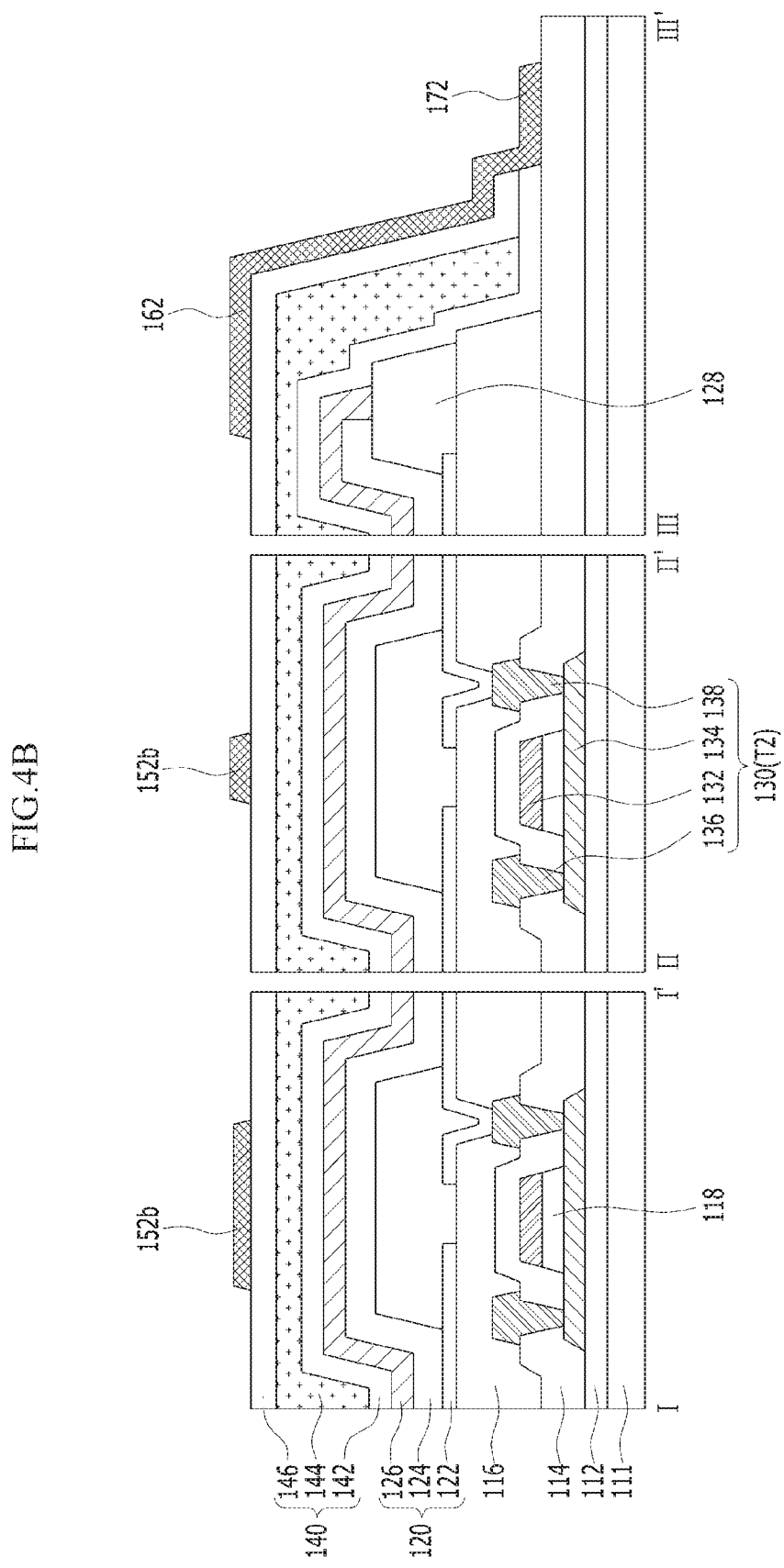

Referring to FIGS. 4A and 4B, the first bridge 152b, the lower routing line 162, and the lower pad electrode 172 are formed on the substrate 111 having the switching transistor T1, the driving thin-film transistor T2 or 130, the light-emitting element 120, and the encapsulation unit 140 formed thereon.

Specifically, a conductive layer is deposited on the entire surface of the substrate 111, having the switching transistor T1, the driving thin-film transistor T2 or 130, the light-emitting element 120, and the encapsulation unit 140 formed thereon, by a deposition process. Subsequently, the conductive layer is patterned by a photolithography process and an etching process using a first mask, whereby the first bridge 152b, the lower routing line 162, and the lower pad electrode 172 are formed. Here, each of the first bridge 152b, the lower routing line 162, and the lower pad electrode 172 is formed in a single layer or in multiple layers using an opaque metal having good conductivity, such as Al, Ag, Ti, Cu, Mo, or MoTi. For example, each of the first bridge 152b, the lower routing line 162, and the lower pad electrode 172 is formed in a triple-layered structure as a stack of Ti/Al/Ti or Mo/Al/Mo.

Figure 5A:
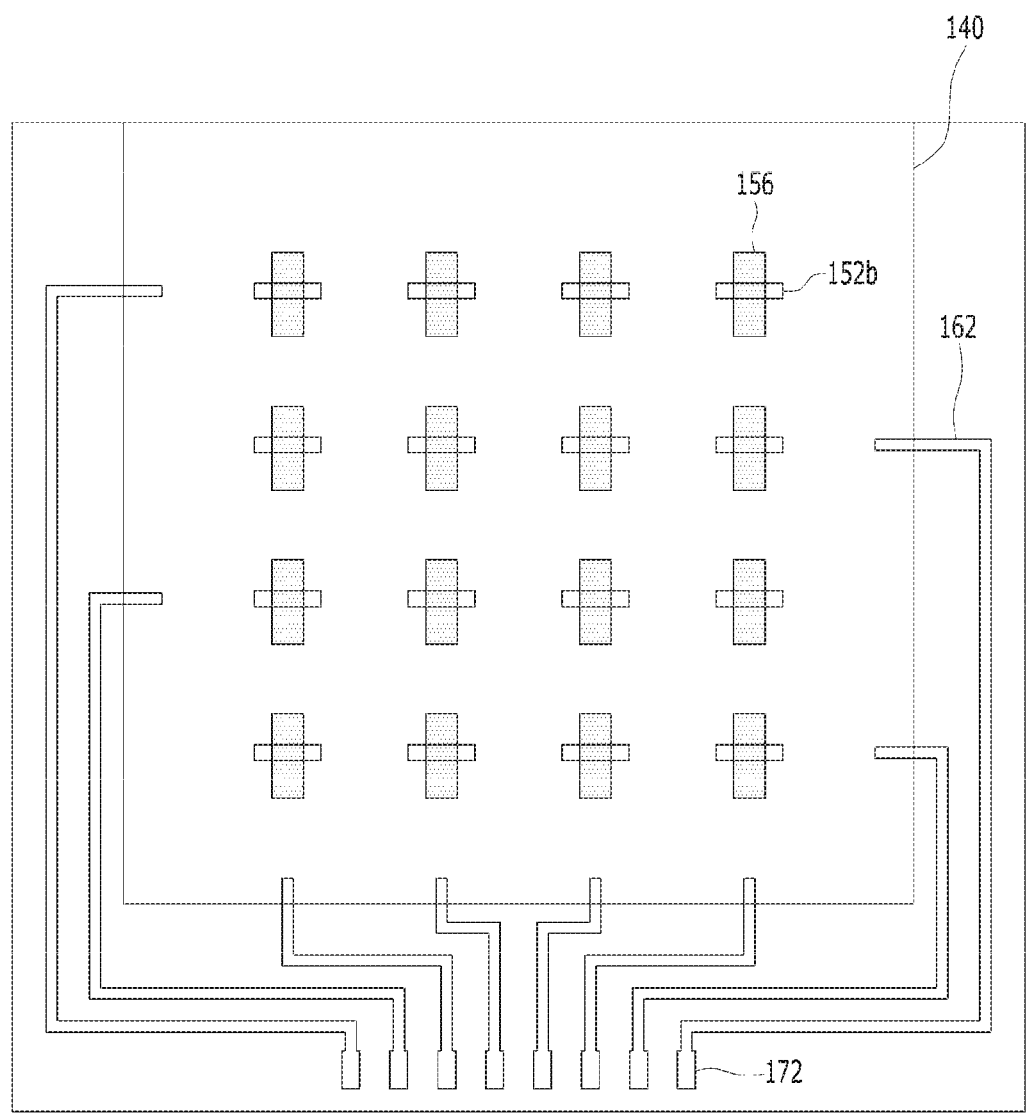
FIGS. 5A and 5B are a plan view and a cross-sectional view, respectively, for explaining a method of manufacturing a touch insulation layer illustrated in FIGS. 2 and 3.
Figure 5B:
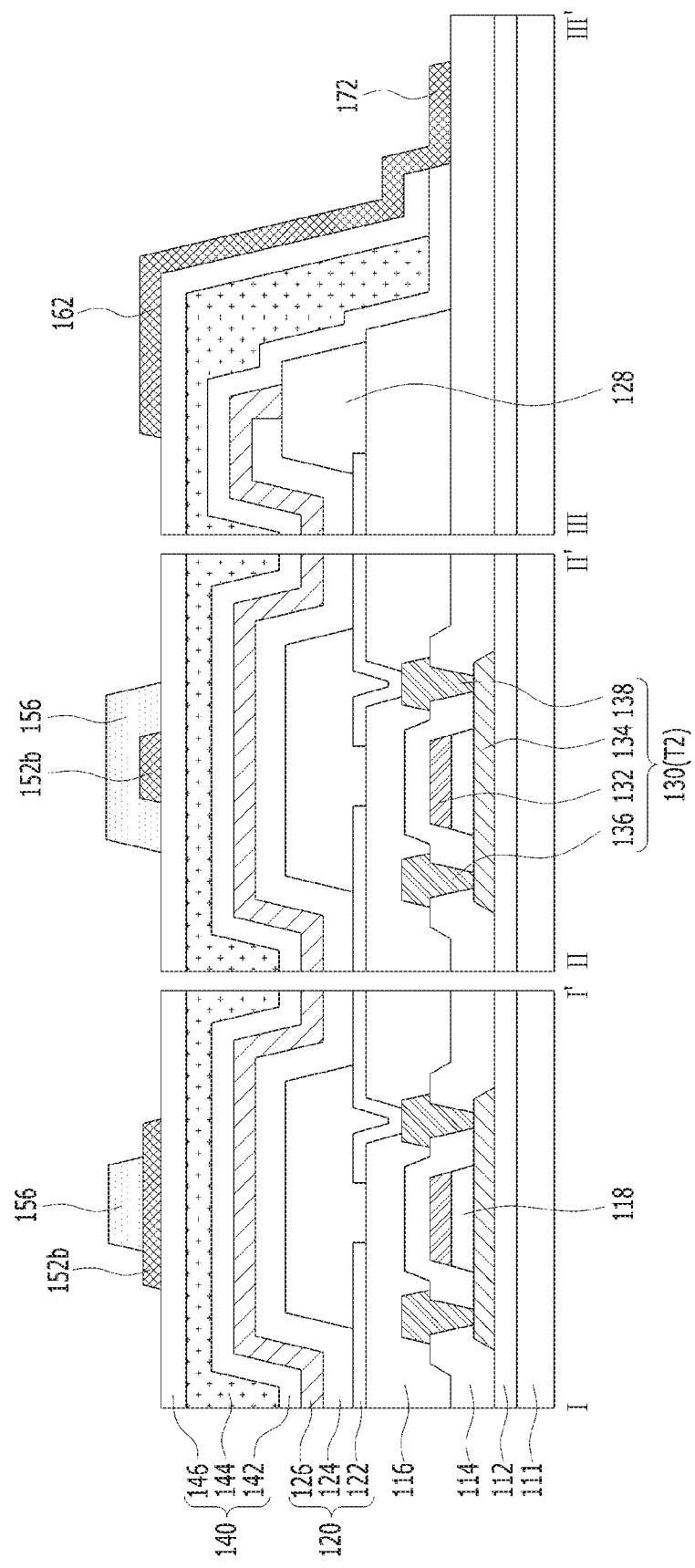

Referring to FIGS. 5A and 5B, the touch insulation layer 156 is formed on the substrate 111 having the first bridge 152b, the lower routing line 162, and the lower pad electrode 172 formed thereon.

Specifically, an inorganic or organic insulation material is deposited on the substrate 111 having the first bridge 152b, the lower routing line 162, and the lower pad electrode 172 formed thereon. Subsequently, the inorganic or organic insulation material is patterned by a photolithography process and an etching process using a second mask, whereby the touch insulation layer 156 is formed. Here, the touch insulation layer 156 may be an inorganic layer such as $SiN_x$, SiON, or $SiO_2$, or may be an acryl-based, epoxy-based, Parylene-C, Parylene-N, Parylene-F, or siloxane-based organic layer.

Figure 6A:
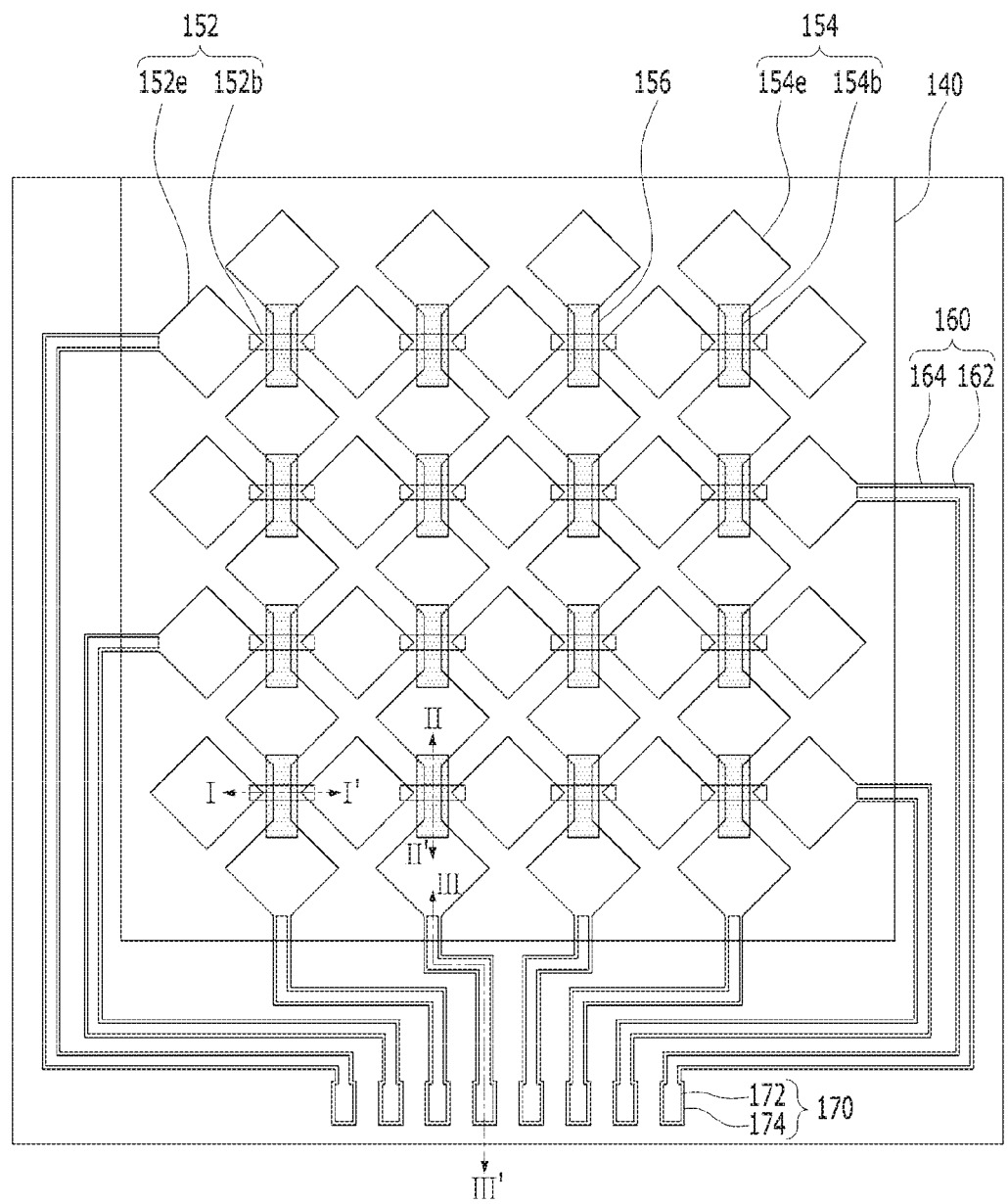
FIGS. 6A and 6B are a plan view and a cross-sectional view, respectively, for explaining a method of manufacturing a second bridge, first and second touch electrodes, an upper routing line, and an upper pad electrode illustrated in FIGS. 2 and 3.
Figure 6B:
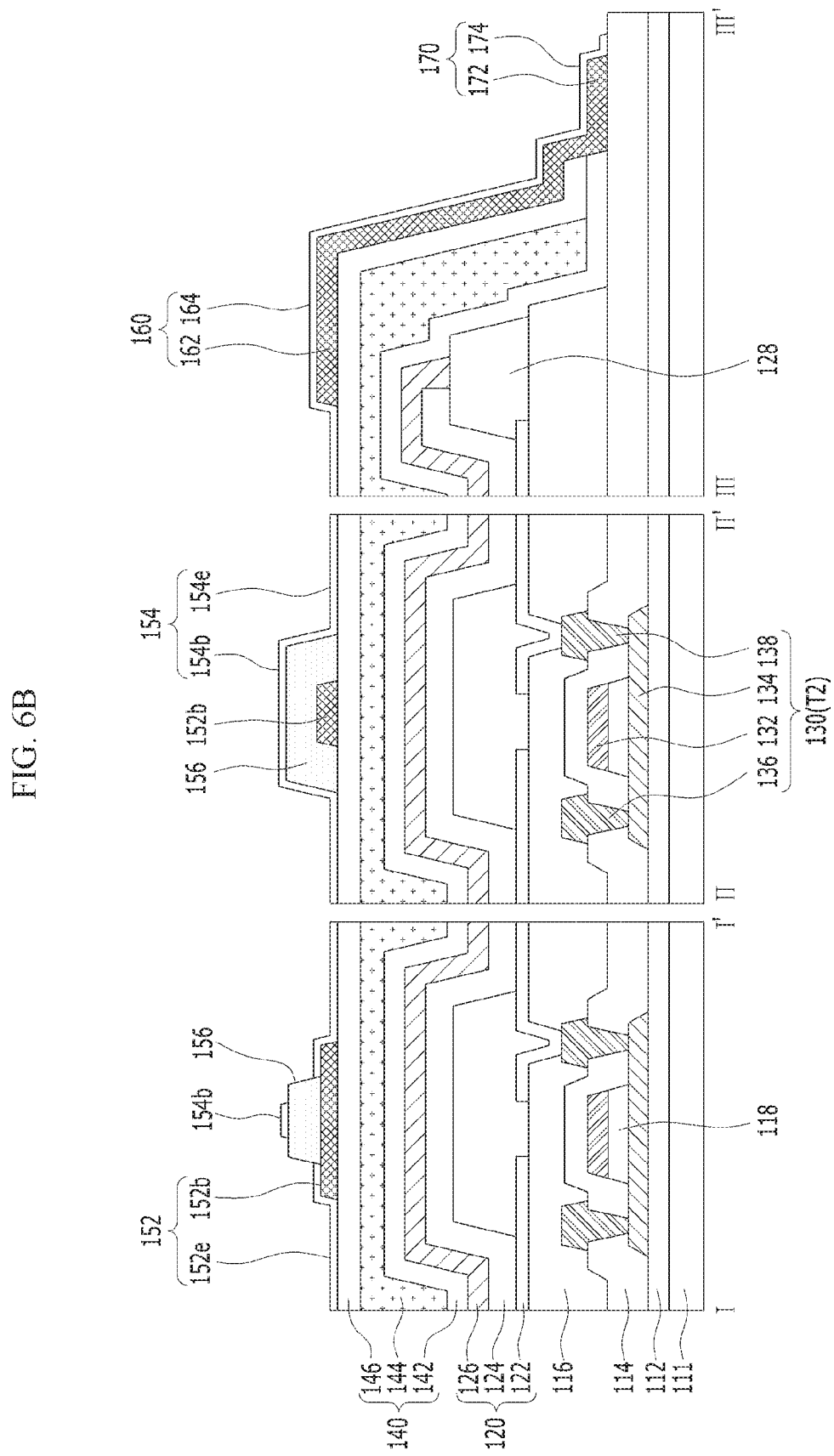

Referring to FIGS. 6A and 6B, the first and second touch electrodes 152e and 154e, the second bridge 154b, the upper routing line 164, and the upper pad electrode 174 are formed on the substrate 111 having the touch insulation layer 156 formed thereon.

Specifically, a transparent conductive layer, such as ITO, IZO, ZnO, IGZO, or ITO/Ag/ITO, is disposed on the entire surface of the substrate 111 having the touch insulation layer 156 formed thereon. Subsequently, the transparent conductive layer is patterned by a photolithography process and an etching process using a third mask, whereby the first and second touch electrodes 152e and 154e, the second bridge 154b, the upper routing line 164, and the upper pad electrode 174 are formed.

In this way, in the present disclosure, since a separate protective structure for protecting each of the first and second touch electrodes 152e and 154e, the second bridge 154b, and the upper routing line 164, which are located at the uppermost portion of the touch sensor, is not necessary, a mask process for forming such a protective structure may be omitted. Thereby, in the present disclosure, since the touch sensor may be formed on the encapsulation unit 140 by the maximum of three mask processes, the structure and the manufacturing process may be simplified, which may increase productivity.

Figure 7:
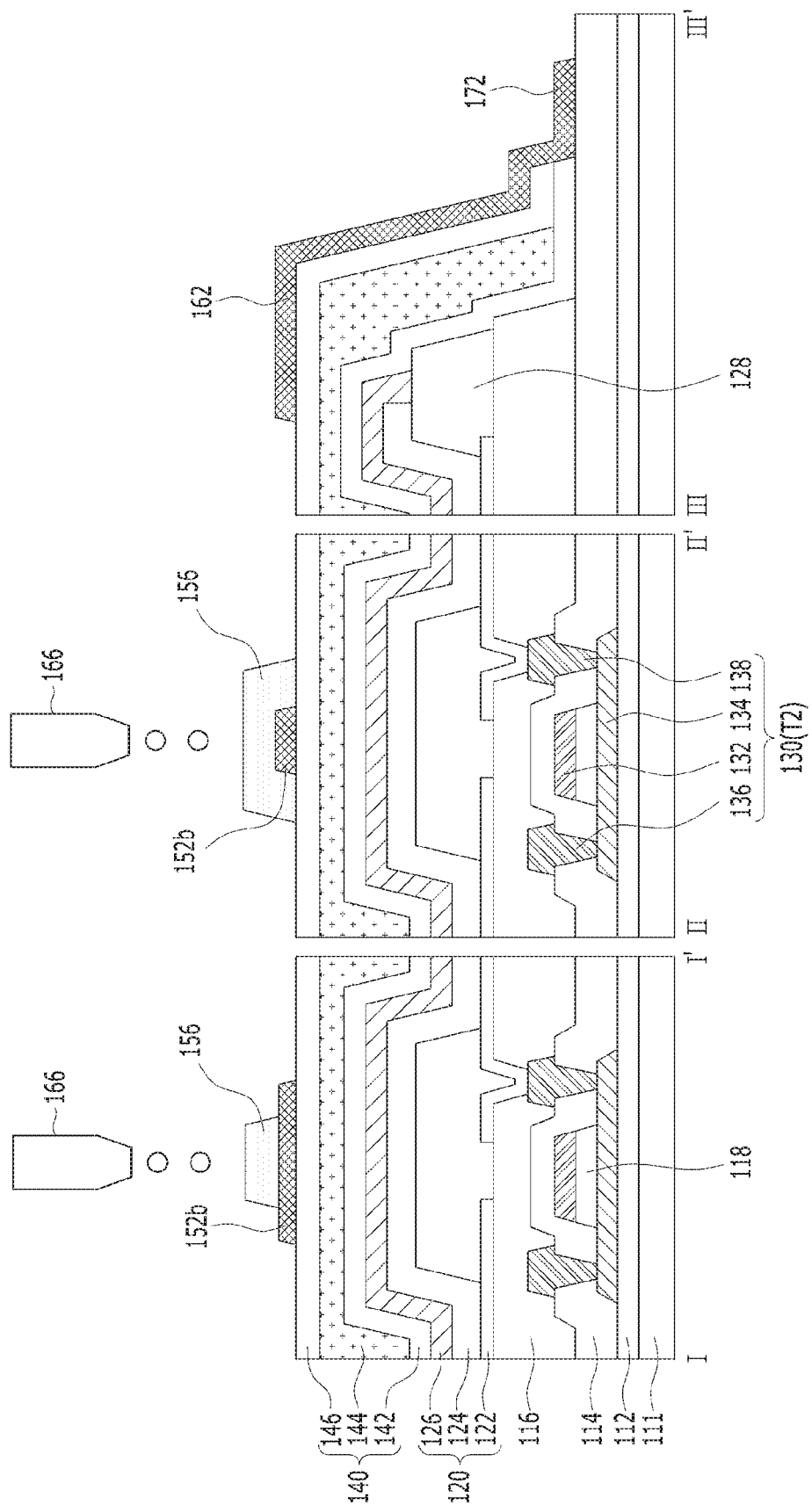
FIG. 7 is a cross-sectional view for explaining another embodiment of the method of manufacturing the touch insulation layer illustrated in FIG. 5B.

Meanwhile, in the present disclosure, a method of forming the touch insulation layer 156 by a mask process has been described by way of example, but the touch insulation layer 156 may be formed by a non-mask process. That is, since the resolution of the touch sensor Cm disposed on the light-emitting element 120 is lower than the resolution of the light-emitting element 120, the touch insulation layer 156 may be formed by an inkjet printing process. Specifically, as illustrated in FIG. 7, after an organic or inorganic insulation liquid drops onto an area that corresponds to the intersection of the first and second bridges 152b and 154b using an inkjet device 166, the dropped organic or inorganic insulation liquid is cured, whereby the touch insulation layer 156 is formed. In this case, in the present disclosure, a mask process for forming the touch insulation layer 156 may be omitted. Thereby, in the present disclosure, since the touch sensor may be formed on the encapsulation unit 140 by the maximum of two mask processes, the structure and the manufacturing process may be simplified, which may increase productivity. In addition, in the present invention, since the touch insulation layer 156 is formed by an inkjet printing process, a process of depositing the touch insulation layer 156, a process of baking a photoresist pattern that is used when forming the touch insulation layer 156, and a process of dry-etching the touch insulation layer 156 are not necessary. Thereby, in the present disclosure, it is possible to prevent the light-emitting stack 124 from being deteriorated by heat generated during the process of depositing the touch insulation layer 156 or the process of baking the photoresist pattern, and it is also possible to prevent the light-emitting stack 124 from being deteriorated by heat and plasma generated during the dry-etching process.

Figure 8:
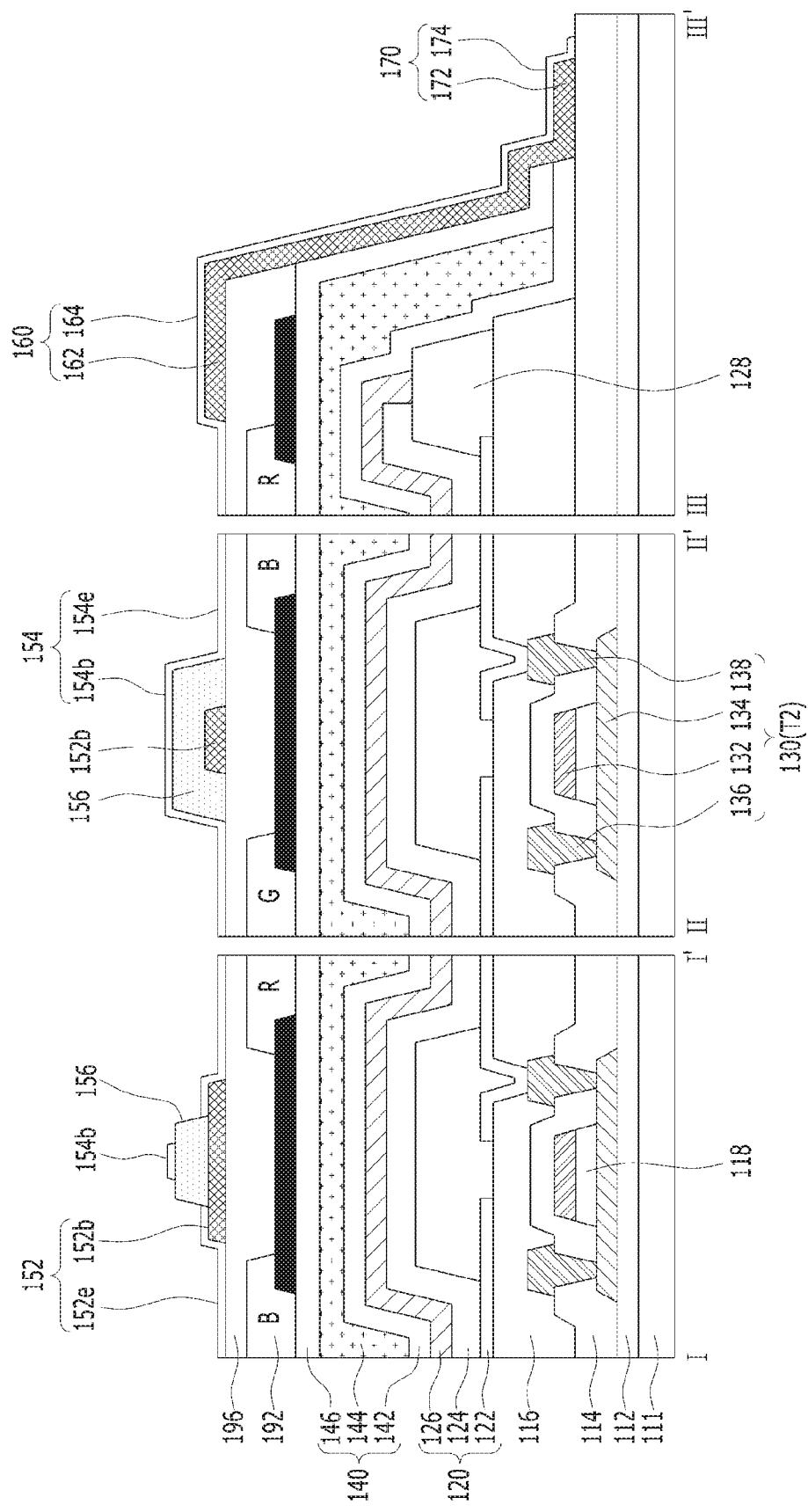
FIG. 8 is a cross-sectional view illustrating an organic light-emitting display device having a touch sensor according to a second embodiment of the present disclosure.

FIG. 8 is a cross-sectional view illustrating an organic light-emitting diode display device having a touch sensor according to a second embodiment of the present disclosure.

The organic light-emitting diode display device illustrated in FIG. 8 includes the same constituent elements as those of the organic light-emitting diode display device illustrated in FIG. 3, except that it further includes color filters 192 disposed between the encapsulation unit 140 and the touch electrodes 152e and 154e. Thus, a detailed description related to the same constituent elements will be omitted below.

The color filters 192 are formed between each of the touch sensing line 154 and the touch driving line 152 and the light-emitting element 120. The distance between each of the touch sensing line 154 and the touch driving line 152 and the light-emitting element 120 is increased by the color filters 192. Thereby, the capacitance of a parasitic capacitor formed between each of the touch sensing line 154 and the touch driving line 152 and the light-emitting element 120 may be minimized, and mutual interaction due to coupling between each of the touch sensing line 154 and the touch driving line 152 and the light-emitting element 120 may be prevented. In addition, the color filters 192 may prevent a chemical solution (e.g., developing solution or etching solution) used in the process of manufacturing the touch sensing line 154 and the touch driving line 152, external moisture, and the like from entering the light-emitting stack 124. Thereby, the color filters 192 may prevent damage to the light-emitting stack 124, which is vulnerable to the chemical solution or moisture. Meanwhile, as illustrated in FIG. 8, the configuration in which the touch electrodes 152e and 154e are disposed over the color filters 192 has been described by way of example, but the color filters 192 may be disposed over the touch electrodes 152e and 154e. In this case, the touch electrodes 152e and 154e are disposed between the color filters 192 and the encapsulation unit 140.

A black matrix 194 is disposed between the color filters 192. The black matrix 194 serves to separate the respective sub-pixel areas from each other and to prevent optical interference and light leakage between adjacent subpixel areas. The black matrix 194 may be formed of a high-resistance black insulation material, or may be formed by stacking at least two colors of color filters among red (R), green (G), and blue (B) color filters 192. In addition, a touch planarization layer 196 is formed on the substrate 111 having the color filters 192 and the black matrix 194 formed thereon. The substrate 111 having the color filters 192 and the black matrix 194 formed thereon is flattened by the touch planarization layer 196.

Figure 9A:
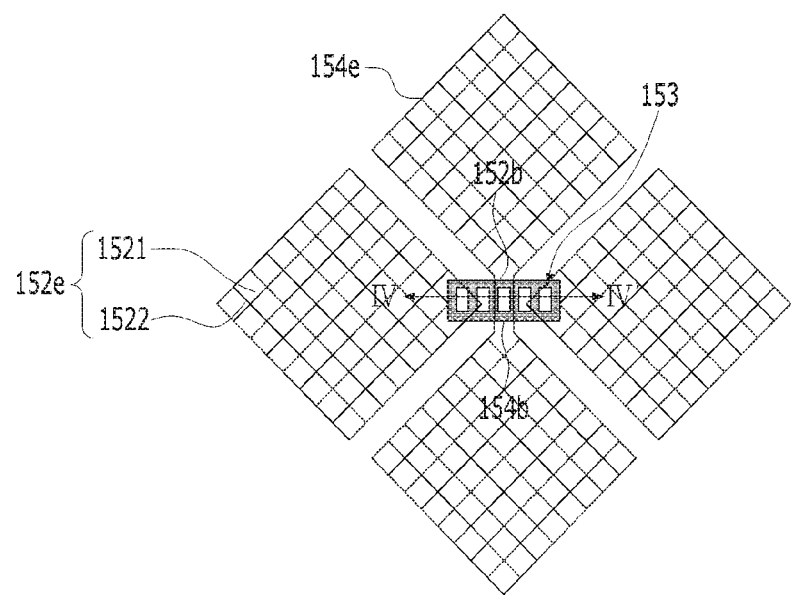
FIGS. 9A and 9B are a plan view and a cross-sectional view, respectively, illustrating another embodiment of first and second touch electrodes and a bridge illustrated in FIG. 3.
Figure 9B:
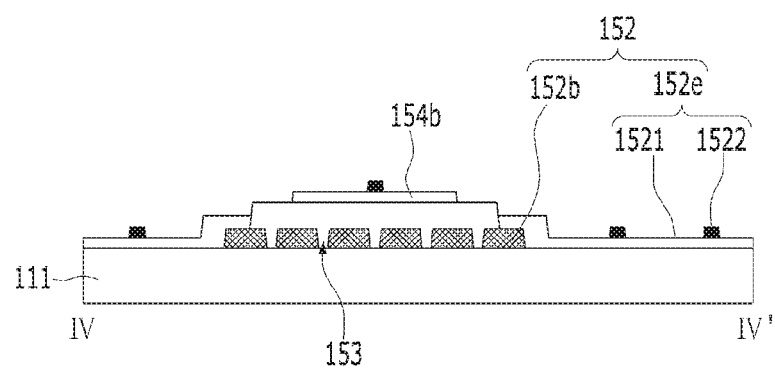

Meanwhile, in the present disclosure, the configuration in which the first and second touch electrodes 152e and 154e and the first and second bridges 152b and 154b are formed to have a plate shape, as illustrated in FIG. 2, has been described by way of example, the first and second touch electrodes 152e and 154e and the first and second bridges 152b and 154b may be formed to have a mesh shape, as illustrated in FIGS. 9A and 9B. That is, the first and second touch electrodes 152e and 154e and the second bridge 154b may be formed of a transparent conductive layer 1521, such as ITO or IZO, and a mesh metal layer 1522 disposed above or below the transparent conductive layer 1521 and having a mesh shape. Alternatively, the touch electrodes 152e and 154e and the second bridge 154b may be formed of only the mesh metal layer 1522 without the transparent conductive layer 1521, or may be formed of the transparent conductive layer 1521 having a mesh shape without the mesh metal layer 1522. Here, the mesh metal layer 1522 is formed to have a mesh shape using a highly conductive layer of at least one of Ti, Al, Mo, MoTi, Cu, Ta, and ITO. For example, the mesh metal layer 1522 is formed in a triple-layered structure as a stack of Ti/Al/Ti, MoTi/Cu/MoTi, or Ti/Al/Mo. Thereby, the resistance and the capacitance of the first and second touch electrodes 152e and 154e and the second bridge 154b may be reduced, and the RC time constant may be reduced, which may result in increased touch sensitivity. In addition, since the mesh metal layer 1522 of each of the first and second touch electrodes 152e and 154e and the second bridge 154b has a very small line width, it is possible to prevent deterioration in the aperture ratio and transmissivity due to the mesh metal layer 1522.

In addition, the first bridge 152b, which is disposed in a plane different from the touch electrodes 152e and 154e, includes a plurality of slits 153, as illustrated in FIGS. 9A and 9B. The first bridge 152b having the slits 153 may have a reduced surface area, compared to the first bridge 152b having no slit 153. Thereby, the reflection of external light by the first bridge 152b may be reduced, which may prevent deterioration in visibility. Since the first bridge 152b having the slits 153 overlaps the bank 128, it is possible to prevent deterioration in the aperture ratio by the first bridge 152b formed of an opaque conductive layer.

As is apparent from the above description, a display device according to the present disclosure includes a touch sensing line and a touch driving line, which intersect each other on an encapsulation unit with a touch insulation layer having an island form therebetween, and the touch insulation layer intersects with any one of the touch sensing line and the touch driving line. Thereby, the structure may be simplified, which may increase reliability. In addition, in the present disclosure, a separate protective structure for protecting each of a touch electrode, a bridge, and an upper routing line, which are disposed at the uppermost portion of a touch sensor is not necessary, a mask process for forming such a protective structure may be omitted. As a result, in the present disclosure, since the touch sensor may be formed on an encapsulation unit by the maximum of two or three mask processes, the structure and the manufacturing process may be simplified, which may increase productivity. Moreover, by disposing touch electrodes on the encapsulation unit, a separate attachment process may not be necessary, which may further simplify the manufacturing process and reduce costs.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
a light-emitting element disposed on a substrate;
an encapsulation unit disposed on the light-emitting element;
a touch sensor disposed on the encapsulation unit and comprising a touch sensing line and a touch driving line;
a touch insulation layer having an island shape and disposed between the touch sensing line and the touch driving line at an intersection of the touch sensing line and the touch driving line;
a touch pad connected to the touch sensor and configured with pad electrodes in multiple layers, the pad electrodes including a first pad electrode and a second pad electrode, and
a routing line disposed between the touch pad and the touch sensor to interconnect the touch pad and the touch sensor,
wherein the second pad electrode is disposed to cover an upper surface and a side surface of the first pad electrode, and
wherein the routing line comprises:
a lower routing line disposed along a side surface of the encapsulation unit; and
an upper routing line overlapped with the lower routing line and disposed along a side surface of the encapsulation unit, and
wherein the encapsulation unit comprises a plurality of inorganic encapsulation layers and at least one organic encapsulation layer, and
wherein the lower and upper routing lines are disposed along an outer side surface of the inorganic encapsulation layer covering a side surface of the organic encapsulation layer.

2. The display device according to claim 1, wherein the touch driving line comprises:
first touch electrodes arranged in a first direction on the encapsulation unit; and
a first bridge configured to interconnect the first touch electrodes,
wherein the touch sensing line comprises:
second touch electrodes arranged in a second direction intersecting with the first direction; and
a second bridge configured to interconnect the second touch electrodes, and
wherein the touch insulation layer is disposed below one of the first and second bridges to extend along the corresponding bridge, and intersects with other of the first and second bridges.

3. The display device according to claim 2, wherein the touch insulation layer is disposed to intersect the first bridge and expose opposite sides of the first bridge, and is disposed to extend along the second bridge with a line width greater than that of the second bridge.

4. The display device according to claim 3, wherein each of the first touch electrodes is disposed to cover an upper surface and a side surface of the first bridge exposed by the touch insulation layer and to contact a side surface of the touch insulation layer.

5. The display device according to claim 3, wherein each of the first touch electrodes directly contacts an upper surface and a side surface of the first bridge exposed by the touch insulation layer.

6. The display device according to claim 2, wherein:
the first pad electrode is formed of a same material as the first bridge and is disposed on an insulation layer, which is disposed below the light-emitting element; and
the second pad electrode is formed of a same material as the second bridge.

7. The display device according to claim 2,
wherein the lower routing line is formed of a same material as the first bridge; and
wherein the upper routing line is formed of a same material as the second bridge and is disposed to cover a side surface and an upper surface of the lower routing line.

8. The display device according to claim 7, wherein the upper routing line is formed of the same material as each of the first and second touch electrodes and extends from each of the first and second touch electrodes.

9. The display device according to claim 7, wherein the lower routing line contacts a side surface of the encapsulation unit.

10. The display device according to claim 2, wherein at least one of the first bridge and the second bridge comprises at least one slit.

11. The display device according to claim 2, wherein at least one of the first and second touch electrodes and the first and second bridges is formed to have a mesh shape.

12. The display device according to claim 1, further comprising a color filter disposed between the encapsulation unit and the touch sensor.

13. The display device according to claim 1, further comprising a bank overlapping with the touch insulation layer having the island shape.

14. A method of manufacturing a display device, the method comprising:
   forming a light-emitting element on a substrate;
   forming an encapsulation unit on the light-emitting element, wherein forming the encapsulation unit includes,
   forming a plurality of inorganic encapsulation layers; and
   forming at least one organic encapsulation layer;
   forming a touch sensor on the encapsulation unit, the touch sensor comprising a touch sensing line and a touch driving line intersecting each other with a touch insulation layer having an island shape therebetween;
   forming a touch pad connected to the touch sensor and configured with pad electrodes in multiple layers; and
   forming a routing line disposed between the touch pad and the touch sensor to interconnect the touch pad and the touch sensor,
   wherein the touch insulation layer is disposed between the touch sensing line and the touch driving line at an intersection of the touch sensing line and the touch driving line,
   wherein the touch pad includes a first pad electrode and a second pad electrode, and the second pad electrode is disposed to cover an upper surface and a side surface of the first pad electrode, and
   wherein the routing line comprises:
   a lower routing line disposed along a side surface of the encapsulation unit; and
   an upper routing line overlapped with the lower routing line and disposed along a side surface of the encapsulation unit, and
   wherein the lower and upper routing lines are disposed along an outer side surface of the inorganic encapsulation layer covering a side surface of the organic encapsulation layer.

15. The method according to claim 14, wherein the forming the touch sensor comprises:
   forming a first bridge of the touch driving line on the encapsulation unit;
   forming the touch insulation layer on the substrate having the first bridge formed thereon; and
   forming first touch electrodes of the touch driving line on the substrate having the touch insulation layer formed thereon, and a second bridge and second touch electrodes of the touch sensing line,
   wherein the touch insulation layer is disposed so as to intersect the first bridge and expose opposite sides of the first bridge, and is disposed so as to extend along the second bridge with a line width greater than that of the second bridge.

16. The method according to claim 15, wherein the forming the touch insulation layer comprises dropping an organic or inorganic insulation solution onto the first bridge using an inkjet, and then curing the organic or inorganic insulation solution.

* * * * *